United States Patent

[11] 3,585,634

[72] Inventor Kenneth R. Sharples
Braintree, Mass.
[21] Appl. No. 749,006
[22] Filed June 31, 1968
[45] Patented June 15, 1971
[73] Assignee Tyco Instrument Division, Inc.
Waltham, Mass.

[54] CYCLICALLY OPERATING ANALOG TO DIGITAL CONVERTER
16 Claims, 12 Drawing Figs.

[52] U.S. Cl. .......... 340/347, 320/1
[51] Int. Cl. .......... H03k 13/02
[50] Field of Search .......... 340/347; 320/1; 235/92

[56] References Cited

UNITED STATES PATENTS

| | | | |
|---|---|---|---|
| 3,170,153 | 2/1965 | Brooks | 340/347 |
| 3,219,801 | 11/1965 | Kobbe et al. | 235/92 |
| 3,392,270 | 7/1968 | Boucke | 235/92 |
| 3,398,265 | 8/1968 | Drage | 235/92 |
| 3,445,839 | 5/1969 | Engelberg | 340/347 |
| 3,449,741 | 6/1969 | Egerton | 340/347 |
| 3,462,759 | 8/1969 | Hoffman | 340/347 |

*Primary Examiner*—Daryl W. Cook
*Assistant Examiner*—Michael K. Wolensky
*Attorney*—Kenway, Jenney & Hildreth

ABSTRACT: An analog to digital converter in which an analog input signal is sampled and a reference voltage is repetitively substracted from the sampled voltage by interchanging a pair of capacitors coupled to the output of a high-gain amplifier until the output of the high-impedance amplifier changes polarity, the number of interchanges serving as a digital indication of the value of the analog input signal.

INVENTOR
KENNETH R. SHARPLES
BY
Kenway, Jenney & Hildreth
ATTORNEYS

INVENTOR
KENNETH R. SHARPLES
BY
Kenway, Jenney & Hildreth
ATTORNEYS

INVENTOR
KENNETH R. SHARPLES
BY
Kenway, Jenney & Hildreth
ATTORNEYS

INVENTOR
KENNETH R. SHARPLES
BY
Kenway, Jenney & Hildreth
ATTORNEYS

INVENTOR
KENNETH R. SHARPLES
BY
Kenway, Jenney & Hildreth
ATTORNEYS

INVENTOR
KENNETH R. SHARPLES
BY
Kenway, Jenney & Hildreth
ATTORNEYS

INVENTOR
KENNETH R. SHARPLES
BY
Kenway Jenney & Hildreth
ATTORNEYS

CYCLICALLY OPERATING ANALOG TO DIGITAL CONVERTER

FIELD OF THE INVENTION

This invention relates in general to analog to digital converters and more particularly to an electronic system for efficiently producing a multiple bit digital output display corresponding to the value of an analog input signal.

BACKGROUND OF THE INVENTION

Analog to digital converters are, of course, well known in the art and find wide use in communication, computer and measurement applications. There are a number of different approaches to the design of analog to digital converters, each approach having its own advantages and disadvantages. One such approach involves the simultaneous comparison of a sampled input analog voltage signal with a number of discrete voltage levels and the output is indicated by the binary state of the comparators at each of the levels. This approach is very fast, however, it involves maintaining with precision a large number of different voltage levels and comparator circuits. Another approach, which is not as rapid, but which is more economical, involves the generation of a variable reference voltage for comparison with a sampled analog signal to provide a digital output indication of the reference voltage level which matches the analog input. In one example, this variable reference voltage is generated by a digital to analog converter which increases the value of its analog output incrementally for each driving pulse, thereby generating a staircase voltage. A comparator indicates when the staircase voltage exceeds the sampled input voltage and the number of driving pulses required to generate this level are serially accumulated to represent the digital value of the analog input voltage. In a similar technique a ramp voltage is generated as a function of time and uniformly spaced clock pulses are counted until the ramp level exceeds the analog input level. The accumulated count represents the digital value of the analog input.

In order to increase the resolution of these converters, they are often operated as cyclic converters. A cyclic converter employs the basic analog to digital conversion block in a system in which a summing junction and an amplifier with adjustable gain are inserted between the sample and hold element and the converter block. Feedback is then provided from the converter block to the summing junction. In operation the converter is run with the amplifier at a specific amplification factor and the output from the converter block is supplied to one section of a register. When the generated voltage equals or exceeds the analog input voltage, a programmer recycles the system, with the voltage generated during the first cycle inverted and fed back to the summing junction; the amplifier gain is increased by a specific factor, usually a factor of 2, and the converter is recycled until a voltage is generated equal to the difference between the analog input voltage and the voltage generated on the first cycle, multiplied by the new setting of amplifier gain. During this second cycle the output from the converter is applied to a second section of the register. The resultant output display is a combination of the digital numbers stored in the two sections of the register. For this type of cyclic converter, the analog elements are relatively complex and expensive, usually requiring an input buffer amplifier, a summing amplifier, an adjustable gain amplifier, a comparator, and precision control switching.

In a number of applications of analog to digital converters, such as a digital volt meter, it may be desired to measure a bipolar analog signal. In order to do this in conventional analog to digital converters, a bipolar reference source must be employed. This bipolar source, together with the number of amplifiers and output display drive elements results in a complex system and a relatively high-cost factor for a precision digital volt meter having even two or three digits.

SUMMARY OF THE INVENTION

Broadly speaking, the present invention provides an efficient, precise analog to digital converter together with a system for displaying the output digits. The converter may accept a unipolar or a bipolar input signal and employs a unipolar reference source. In the system of the invention, the input voltage is sampled and held on a capacitor which is connected through a switching element so that in one portion of the operating cycle it is connected in the feedback loop between the output terminal of a high-gain amplifier and one of the input terminals. A precise reference voltage may be coupled between ground and the other input terminal of the high-gain amplifier. During this portion of the cycle a second capacitor, equal in value to the first, is connected between the output terminal of the amplifier and ground. The second capacitor is charged at this time to a voltage equal to the sampled analog voltage minus the reference voltage. By switching the position of the capacitors so that the second capacitor is connected to between the output and input terminals of the amplifier and the first capacitor is now connected between the output terminal and ground, the first capacitor becomes charged to a voltage equal to the sampled input analog voltage less twice the reference voltage.

By repeating this operation the reference voltage is repetitively subtracted from the sampled analog input voltage until the output from the amplifier changes polarity indicating that the reference voltage is a larger quantity than the remainder of the sampled analog input. The number of times the capacitor is switched is accumulated as a decimal digit output representative of the value of the sampled analog input voltage. The circuit also includes diodes and resistors arranged such that, upon the change of polarity of the amplifier output voltage, one capacitor is charged to a value 10 times the remainder voltage and the system is then again repetitively cycled to determine the number of times the reference voltage may be subtracted from this amplified remainder, with this number serving as the nine's complement of the second digit for the digital representation of the originally sampled analog input voltage. For more than two digits the process may be repeated, with the odd cycles providing the digital value directly, and the even cycle the nine's complement of the digits value.

The system of this invention permits a single high-input-impedance amplifier to be used to perform the functions of providing: a high impedance to the sampled input signal and to the reference supply, a buffer for the two storage capacitors, a summing circuit for repetitively subtracting the reference signal from the sampled analog input and a comparator amplifier.

DESCRIPTION OF PREFERRED EMBODIMENTS

Figures 1, 2:
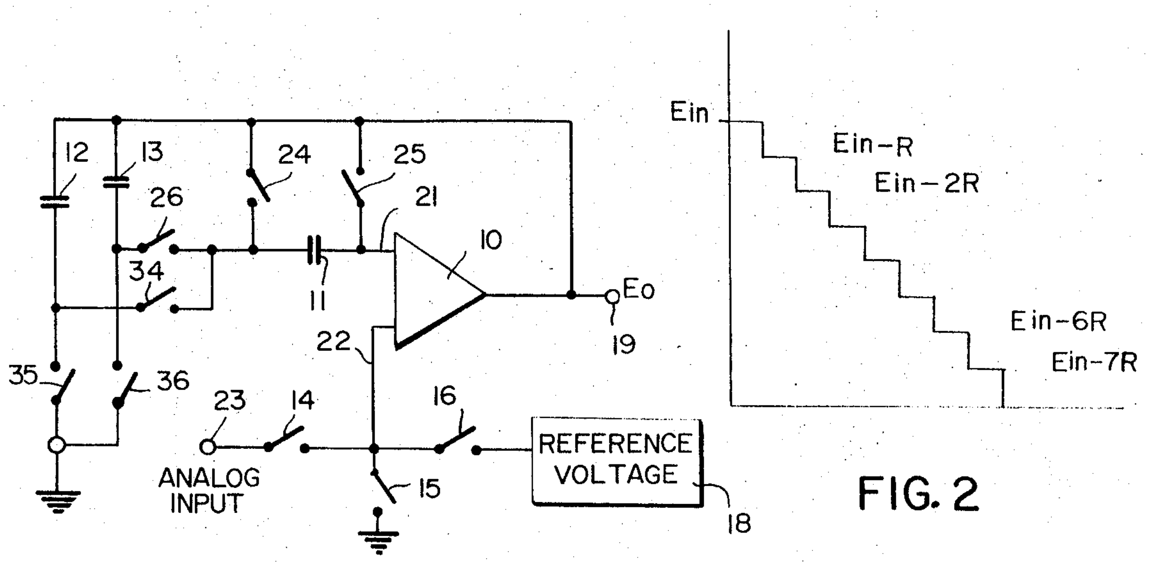
FIG. 1 is an illustration in schematic form of the basic converter circuit for this invention.
FIG. 2 is a graphical illustrating of the output as a function of time of the amplifier illustrated in FIG. 1.

With reference to FIG. 1, there is illustrated the basic circuit configuration for the converter of this invention. By appropriate operation of the switches, the converter may be sequenced to perform three operations: DC stabilization of the amplifier, sampling of the analog input signal, and repetitive subtraction of a reference voltage from the stored analog input signal to generate a digital value for the input signal. As will be explained below in more detail in connection with subsequent figures, the switches are operated by a programmer, not illustrated in FIG. 1, and the number of subtractions required to reduce the analog input signal to approximately zero are counted by a register, also not shown in FIG. 1, to provide the digital output signal.

In the circuit of FIG. 1 an operational amplifier 10, which may be a conventional high-gain operational amplifier has its output terminal connected directly to a common junction between two equal value capacitors 12 and 13. One input terminal 21 of the amplifier 10 is connected directly to one side of a third capacitor 11 and also to one side of switch 25, the other side of which is connected to the output terminal 19. A second switch 24 is connected to the output terminal 19 and the other side of capacitor 11. The sides of capacitors 12 and 13 which are not connected to the output terminal 19 are connected to a switching network which includes switches 26, 34, 35 and 36. This switching network permits these capacitors to be switched alternatively to ground or through capacitor 11 to input terminal 21. The second input terminal 22 of amplifier 10 is connected to three switches 14, 15 and 16, which permits this timer to be connected to either the analog input terminal 23, ground or the reference voltage 18.

For precision operation over periods of time the amplifier 10 must be DC stabilized at intervals to correct for variations in offset voltage. In order to DC stabilize this amplifier 10, the capacitor 11 is charged to the input offset voltage of the amplifier with the second input terminal 22 referenced to ground. To accomplish this switch 15 is closed and switches 14 and 16 are opened connecting terminal 22 to ground. Switches 25, 34 and 35 are closed and switches 24 and 26 are open placing capacitor 11 directly across the output from amplifier 10. Under this circumstance, the input voltage to the amplifier 10 with reference to ground is the DC offset voltage, $\Delta e$. The output voltage $E_o$ appearing at output terminal 19 is $-\Delta e$. Since this output voltage is directly applied across capacitor 11, then capacitor 11 charges to the voltage $-\Delta e$.

After capacitor 11 has charged, switch 25 and 34 are opened and switch 24 is closed placing the capacitor 11 across the amplifier 10. For an infinite gain amplifier, the output potential at terminal 19 must now be zero, since the capacitor across the amplifier is charged to the input offset voltage.

In order to sample the analog input voltage, the switch 14 is closed and switches 15 and 16 are opened coupling the analog input voltage directly to terminal 22 of amplifier 10. Switch 25 is opened, switch 24 is closed, switches 26 and 34 are opened and one of switches 35 and 36 are closed, depending upon which of the capacitors 12 and 13 is to be initially charged. If capacitor 12 is to be initially charged, then switch 35 is closed. With the circuit in this configuration capacitor 11 is across the amplifier 10 and capacitor 12 is connected directly from the output terminal 19 of the amplifier 10 to ground through switch 35. If the analog input voltage is designated $E_{in}$, then capacitor 12 will charge to $E_{in}$. Once this capacitor 12 has charged to $E_{in}$, if switch 24 and switch 35 are opened and switch 34 is closed, capacitor 12 is in series with capacitor 11 across the amplifier 10. If the input terminal 22 of amplifier 10 is connected directly to ground through switch 15, the output signal $E_o$ from amplifier 10 will remain equal to $E_{in}$.

To the extent that the potential of input terminal 22 is raised above ground then the potential at the output terminal will also be raised. This characteristic serves as a basis for the subtraction operation of the circuit. A reference voltage, much smaller in magnitude and of opposite polarity to the voltage $E_{in}$ which was sampled and stored on capacitor 12, is coupled from source 18 to input terminal 22, thereby decreasing the voltage, $E_o$ at output terminal 22 to $E_{in}-E_R$, when $E_R$ is the reference voltage. By closing switch 36 under these conditions capacitor 13 is coupled directly between the output terminal 19 and ground and this capacitor then charges to the output voltage, that is $E_{in}-E_R$. At this point, switches 24, 25, 26 and 35 are open, switch 34 is closed, so that capacitor 12 remains connected in series with capacitor 11 across amplifier 10.

By simultaneously opening switch 36 and 34, while closing switch 26 and 35, the positions of capacitors 12 and 13 are interchanged. Capacitor 13 is now in series with capacitor 11 across amplifier 10 and capacitor 12 is connected between the output terminal 19 and ground. Since the capacitor 13 was charged to the voltage, $E_{in}-E_R$, and since input terminal 22 is still connected through switch 16 to the reference voltage source 18, the output voltage from the amplifier 10 will become, $$E_o=(E_{in}-E_R)-E_R,$$

and capacitor 12 now charges to $E_{in}-2E_R$.

Opening switches 35 and 26 and closing switches 34 and 36, again switches capacitor 13 to the output and capacitor 12 to the input. Thus by repetitively operating these switches the output voltage $E_o$, from amplifier 10 assumes a staircase voltage form, as illustrated in FIG. 2. If a comparator circuit is coupled to the output terminal 19 to detect when the output voltage $E_o$ changes polarity, then the number of times that the switches operate to interchange the capacitors prior to this change of polarity of the output signal $E_o$, is a digital indication of the value of the analog input signal $E_{in}$.

While in the circuit of FIG. 1, the reference voltage source 18 is connected between terminal 22 and ground, the same basic operation will result if this source is connected anywhere in the amplifier loop such that it raises the potential of the noncommon side of each capacitor sequentially either when the capacitors are across the amplifier 10, or between the amplifier output and ground. Thus the reference voltage source 18, might be connected between capacitor 11 and the terminals of switches 26 and 34, or between ground and switches 35 and 36, as well as in the position shown.

Utilizing circuitry of this type, the resolution of the converter will depend upon the quantitative value of the reference voltage. For example, if the reference voltage in the diagram of FIG. 2 were equal to 1 volt and the analog input voltage $E_{in}$ were equal to 8 volts, then eight steps would be required for the voltage to be reduced to zero and the digital representation for the analog input voltage would be 8. If the ultimate resolution of the converter is required to be better than 1 volt, for example 0.01 volt, then the sequence for 8 volts would include 800 switchings of the capacitors, Such a device is a difficult design problem inasmuch as some small amount of charge is lost at each switching of the capacitor and the accuracies of all the components of the circuit must be very precise. In addition, the time consumed in making a conversion with this type of resolution is very lengthy.

Figure 3:
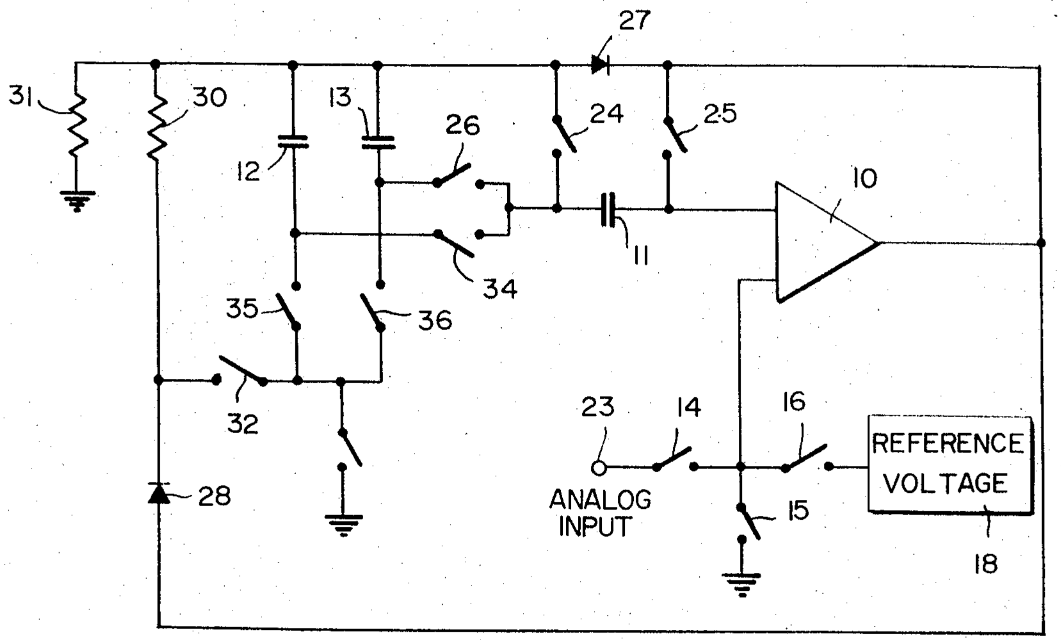
FIG. 3 is an illustration in schematic form of the converter of FIG. 1, modified to provide for a plurality of digits.

An alternative method of improving the resolution is to operate the converter in a cyclic fashion. With the addition of further circuitry, the basic converter illustrated in FIG. 1 may operate cyclically to provide a decimal multiple digit output value for each analog input signal. In FIG. 3 a converter circuit suitable for cyclic operation is illustrated and, in this figure, like parts of FIG. 1, are illustrated by like numbers. In addition to the circuit components included in the configuration of FIG. 1, the multiple bit converter of FIG. 3 includes a diode 27 connected between output terminal 19 and the common junction between capacitors 12 and 13 in a direction to pass negative signals from the output to the capacitors. A similar diode 28 is connected from output terminal 19 in the opposite direction through resistor 30 to this same junction. A second additional resistor 31 is connected between this junction and ground and resistor 31 is selected to be one-tenth the value of resistor 30. In this configuration two additional switches 29 and 32 are needed, with switch 29 being connected between ground and the sides of switches 35 and 36 which were connected to ground in the circuit of FIG. 1. Additional switch 32 is connected from this same point on switches 35 and 36 to the junction between resistor 30 and diode 28.

In operation, the DC stabilization step is carried out in the same fashion as it was for the circuit of FIG. 1 with switch 15 and switch 25 closed and capacitor 11 connected to ground through any suitable switching path. The exact path of grounding the other side of capacitor 11 will depend upon convenience of switching for the entire sequence of steps. One suitable path is through switch 24 and resistor 31, provided that amplifier offset is less than the biases required for diodes 27 and 28. In the usual case, the offset would be at least an order of magnitude less than these biases and hence this path to ground is acceptable.

After the amplifier has been DC stabilized, the input voltage, $E_{in}$, which for this circuit configuration must be negative, is sampled by closing switch 14 with switch 25 open and switch 24 closed and the remainder of the switches in the same positions as they were for the sampling step in the operation of the circuit of FIG. 1. The additional switch 29 is in the closed position and the additional switch 32 is open.

Once the analog input voltage is sampled, the circuitry is sequentially switched to place first capacitor 12 and then capacitor 13 in series with capacitor 11 across the amplifier 10, while the other capacitor is connected between output terminal 19 and ground, the reference source 18 being connected between terminal 22 and ground. Switch 29 remains closed during conversion of the first digit while switch 32 remains open. As in the previous case the switching continues until the output voltage from the amplifier 10 changes polarity, in this instance becoming positive. At this point the number of sequential switching operations which have been tabulated represent the first digit of the multiple digit output representation of the analog input voltage. This accumulation requires, of course, circuitry not illustrated in FIG. 3.

Figure 4:
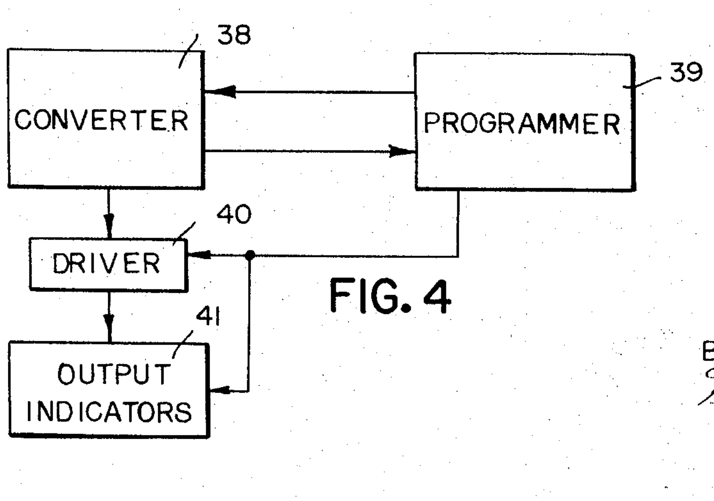
FIG. 4 is an illustration in block diagrammatic form of an analog to digital converter and output display system embodying the principles of this invention.

In FIG. 4, a simplified block diagram of the overall system is shown, in which the converter 38 is operated by a programmer 39, with the latter in turn receiving information from the converter and output information being supplied from the programmer 39 to driver 40 and to the output indicators 41. Typically the programmer may operate the switches of FIG. 3 in a timed sequence to first DC stabilize the amplifier, then sample the input voltage and then sequentially countdown and sampled analog input voltage by switching of capacitors 12 and 13. The change of polarity of the output 19 of the amplifier 10 may be coupled to programmer 39 to indicate to the programmer the completion of one digit and initiate the proper program sequence for display of the first digit and countdown of the second digit. For example, the programmer 39 may provide the clock pulses, which are operating the sequential switching of switches 34, 26, 35, and 36 to the driver 40 and thence to a selected one of multiple bank of output indicators in 41 in order to register the digital value for the first digit. Upon receipt of the change of polarity signal the programmer can switch the selected one of the indicators to a counter representing the second digit. The program can therefore be arranged to cycle the converter and output displays for the number of digits the system is designed to indicate.

As above mentioned, the first digit count is completed when the output signal from amplifier 10 changes polarity indicating that the quantity from which the last reference voltage was subtracted was smaller than the reference voltage itself. When this occurs, and the output becomes positive, diode 27 is back biased and stops conducting and diode 28 is forward biased and commences conducting. The conductive path from output terminal 19 is now through diode 28 and resistors 30 and 31 to ground. The voltage appearing between the common junction of the capacitors 12 and 13 and ground, and therefore across resistor 31, is the difference between the reference voltage and the remaining increment of the analog input voltage which was stored on one of the two capacitors 12 and 13 which was last in the feedback loop. Since resistor 30 is 10 times the size of resistor 31, the voltage between the cathode of diode 28 and ground must be 11 times the voltage across resistor 31.

In a numerical example, if the reference voltage is +1 volt and the analog input voltage originally sampled was 8.3 volts, then the voltage stem which produced the change in the amplifier output voltage polarity would result in the voltage across resistor 31 becoming +0.7 volts and the voltage between the cathode of diode 28 and ground would be +7.7 volts.

The programmer is arranged, to open switch 29 and close switch 32 in response to this change of polarity. Under these conditions, the capacitor 12 or capacitor 13, which ever is in the position to be charged will charge to a voltage equal to the potential across resistor 30 (+7 volts in the numerical example). Assuming that this capacitor is capacitor 12, then on the next step, switch 34 is closed placing capacitor 12 in series with capacitor 11 across the amplifier 10 and switch 32 is opened and switch 29 is closed placing capacitor 13 across the output to ground. The inclusion of the charged capacitor 12 in the feedback circuit results in the amplifier output voltage, $E_o$ becoming the voltage across capacitor 12 plus $E_R$, or −7 volts $+E_R$ in the numerical example, and capacitor 13 is charged to this voltage. The programmer then operates this circuit in sequence in the same fashion as it did for the first digit, thereby generating a digital output which is the nine's complement of the second digit representing the analog input voltage sampled by the converter.

Figures 5, 6:
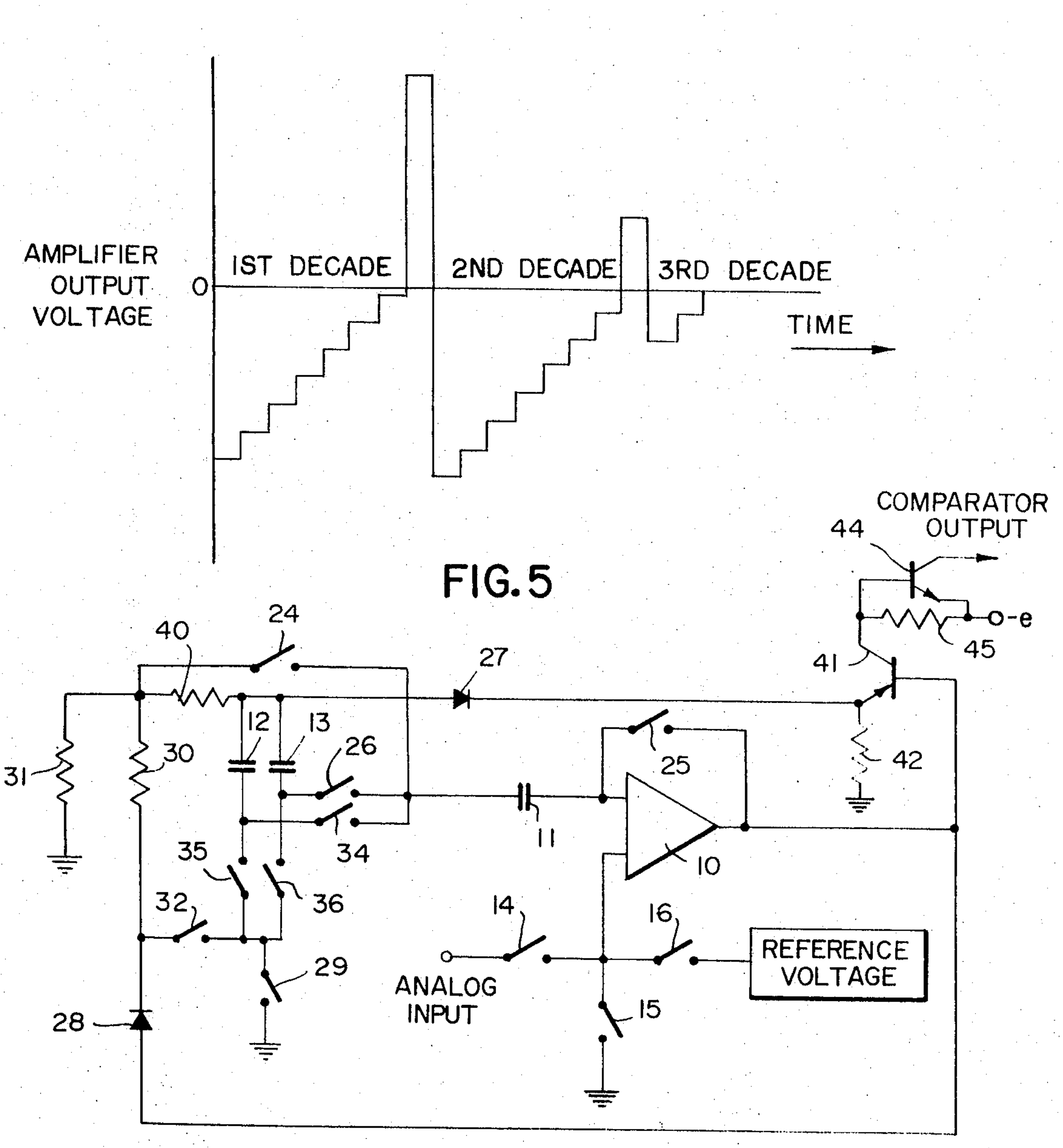
FIG. 5 is an illustration in graphical form of the output signals as a function of time of the amplifier illustrated in FIG. 3.
FIG. 6 is an illustration in schematic form of another embodiment of a converter constructed in accordance with the principles of this invention.

For a third decade the same action would occur when the polarity again changed at the end of the countdown on the second digit. The waveform at the output terminal 19 of the circuit is illustrated in FIG. 5 for an input sampled voltage of 6.23 volts. As previously pointed out, the count for the second decade is the nine's complement of the actual count, so that the digital representation would indeed be 6.23.

In order for the converter to be an absolute value converter, it must be capable of responding to signals of either polarity, and provide an output indication of the polarity of the received signal. In the circuit of FIG. 3, a gain of 10 was provided for positive signals and, for a bipolar converter, this gain must be provided for negative signals as well. In FIG. 6, there is illustrated a converter circuit for bipolar input signals and this circuit further includes a precision comparator circuit for detecting the completion of each decade of conversion. This comparator circuit is provided by transistors 41 and 44, together with their associated resistors 45 and 42. The additional factor of 10 gain is provided by resistor 40 which is connected between the common junction of capacitors 12 and 13 and the junction of resistors 30 and 31. Resistor 40 is equal in value to resistor 30 and is, of course, 10 times the resistance of resistor 31. Although the converter responds to an analog input voltage of either polarity, the reference source needs to be only one polarity.

When an input signal to be sampled is applied through switch 14 to the circuit, switch 24 is, as in the previous circuit arrangements, closed, switch 29 is open and switch 32 is closed. Under these circumstances the junction of the three resistors 30, 31 and 40 is maintained at the input potential and for an input signal of either polarity the appropriate capacitor 12 or 13 will charge to 10 times the potential, $E_{in}$ and the voltage across the capacitor will be in the same direction for input signals of either polarity. After the capacitor has been charged to the input value, switch 24 is opened and the programmer is sequenced to store voltage in the same fashion as for the circuit of FIG. 3.

The function of the transistors 41 and 44 is to provide an output signal indicating the change of polarity in the amplifier output voltage at the conclusion of the conversion of each decade. The transistor 41 couples the output at terminal 19 from amplifier 10 through its base and emitter to diode 27. This coupling itself acts as a diode and passes only negative output signals through it. Assuming amplifier 10 has infinite gain, a negative signal required at the junction of capacitors 12 and 31 will result in the amplifier output potential becoming of sufficient amplitude to supply this negative potential. The amplitude of this negative potential equals the drop across the emitter base junction of transistor 41 plus the potential drop across diode 27 plus the amplitude that is required at the junction of capacitors 12 and 13 for small signals. The drop across diode 27 is normally in the order of one-half volt as is the drop across the emitter base junction of transistor 41. The minimum voltage then across resistor 42 is approximately 0.5 volt and the collector current of transistor 41 then must equal 0.5 volt divided by the resistance of resistor 42. The transistor 44 amplifies this collector current and the comparator output is taken from the collector of transistor 44. When the signal at the output terminal 19 is zero, or positive, transistor 44 is cutoff and there is no signal from the comparator output.

In Chart I below there is tabulated the position of the switches illustrated in FIG. 6 for each of the operational functions of a 3-decimal digit converter.

CHART I

| | Events | | | | | | |
|---|---|---|---|---|---|---|---|
| | 1 | 2 | 3 | 4 | 5 | 6 | 7 |
| Switches | Store $E_{in}$ | Convert 1st digit | Store 1st digit remainder of display 1st digit | Convert 2nd digit | Store 2nd digit remainder of display 2nd digit | Convert 3rd digit | $D_1C$ stablize amplifier to display 3rd digit |
| 25 | Open | Open | Open | Open | Open | Open | Close. |
| 35, 26 | Open | Close/open | Close/open | Open/close | Open/close | Close/open | Open. |
| 36, 34 | Close | Open/close | Open/close | Close/open | Close/open | Open/close | Close. |
| 14 | Close | Open | Open | Open | Open | Open | Open. |
| 15 | Open | Open | Open | Open | Open | Open | Close. |
| 16 | Open | Close | Close | Close | Close | Close | Open. |
| 24 | Close | Open | Open | Open | Open | Open | Close. |
| 29 | Open | Close | Open | Close | Open | Close | Open. |
| 32 | Close | Open | Close | Open | Close | Open | Close. |

As previously mentioned there are a number of alternative paths for grounding capacitor 11 during the DC stabilization portion of the cycle, however, a ground return through switch 24 and resistor 31 is provided in order not to disturb the symmetry of the operation of the switches 34, 35, 36 and 26, since switches 35 and 26 are normally open when switches 34 and 36 are closed and vice versa. The ground return through switch 24 and resistor 31 is appropriate only if the offset voltage to be expected is less than the thresholds potential of diodes 27 and 28 in series with transistor 41. The conduction threshold of these diodes is about 0.3 volt which is sufficiently high for the expected maximum offset of a differential front end amplifier, which would be in the order of 0.1 volt.

With reference to Chart I, it is clear that there are at least two basic timing signals required in the programmer for operating this converter. The first timing basis is for events 1, 3, 5 and 7 and the second for the interchanging of capacitors 12 and 13 during each of the conversion cycles. Still another time factor arises in determining the completion of a conversion cycle where the remainder signal is very small, near zero. For example, if the threshold level of the comparator circuit formed by transistors 41 and 44 is approximately −1 volt with reference to output terminal 19, and the resolution of the converter is 1 millivolt, then the comparator resolution would normally be better than 0.2 millivolt. The gain of the amplifier required to cross this comparator threshold is then a gain of 5,000. For these small signals the time allowed for the comparison to be made must be greater than the amplifier settling time, yet for larger signals a much shorter time is adequate.

The necessity for providing this extra time can be seen from a numerical example. For instance, if the initial charge on capacitor 12 is −2.001 volts and the reference voltage is +1 volt then, with capacitor 12 in the loop across amplifier 10, capacitor 13 would charge to −1.001. Upon the interchange of capacitors, capacitor 12 would next charge to −0.001 volt. However, since capacitor 12 had a charge of −2.001 volts on it, the amplifier output is positive providing a comparator output. If the next switch operation is delayed, then as capacitor 13 charges to −0.001 volt the amplifier output will go from its positive value to −0.001 volt and the comparator output would disappear. This extra delay for values close to zero may be obtained by having a separate time signal from a different clock, however, the same effect may be achieved by controlling the frequency output of a basic clock with control signals from the circuit itself. Such a timing circuit is illustrated in FIG. 7.

Figure 7:
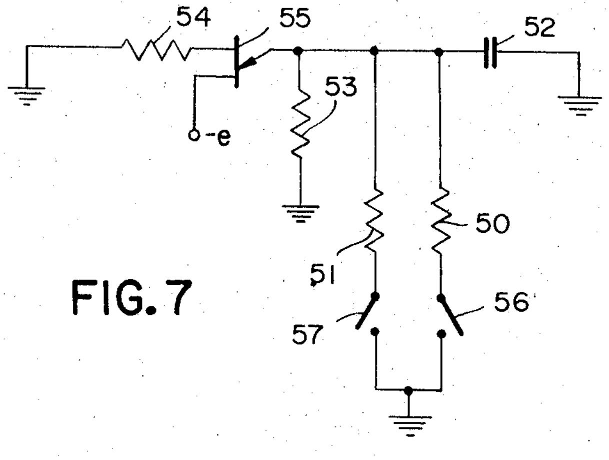
FIG. 7 is an illustration in schematic form of a frequency selective clock oscillator useful in the practice of this invention.

With reference to FIG. 7 an oscillator is shown which has a frequency dependent upon an RC time constant. A unijunction transistor 55 is the basic element of the oscillator and the relaxation time of the oscillator is dependent upon the value of capacitance 52 and resistors 50, 51 and 53. A pair of switches 57 and 56 may be operated selectively to place either resistor 51 or resistor 50 in parallel with resistor 53 to ground. When both switches are closed, the frequency is highest and when both are open the frequency is lowest. If one is open and one closed an intermediate frequency is produced.

Figure 8:
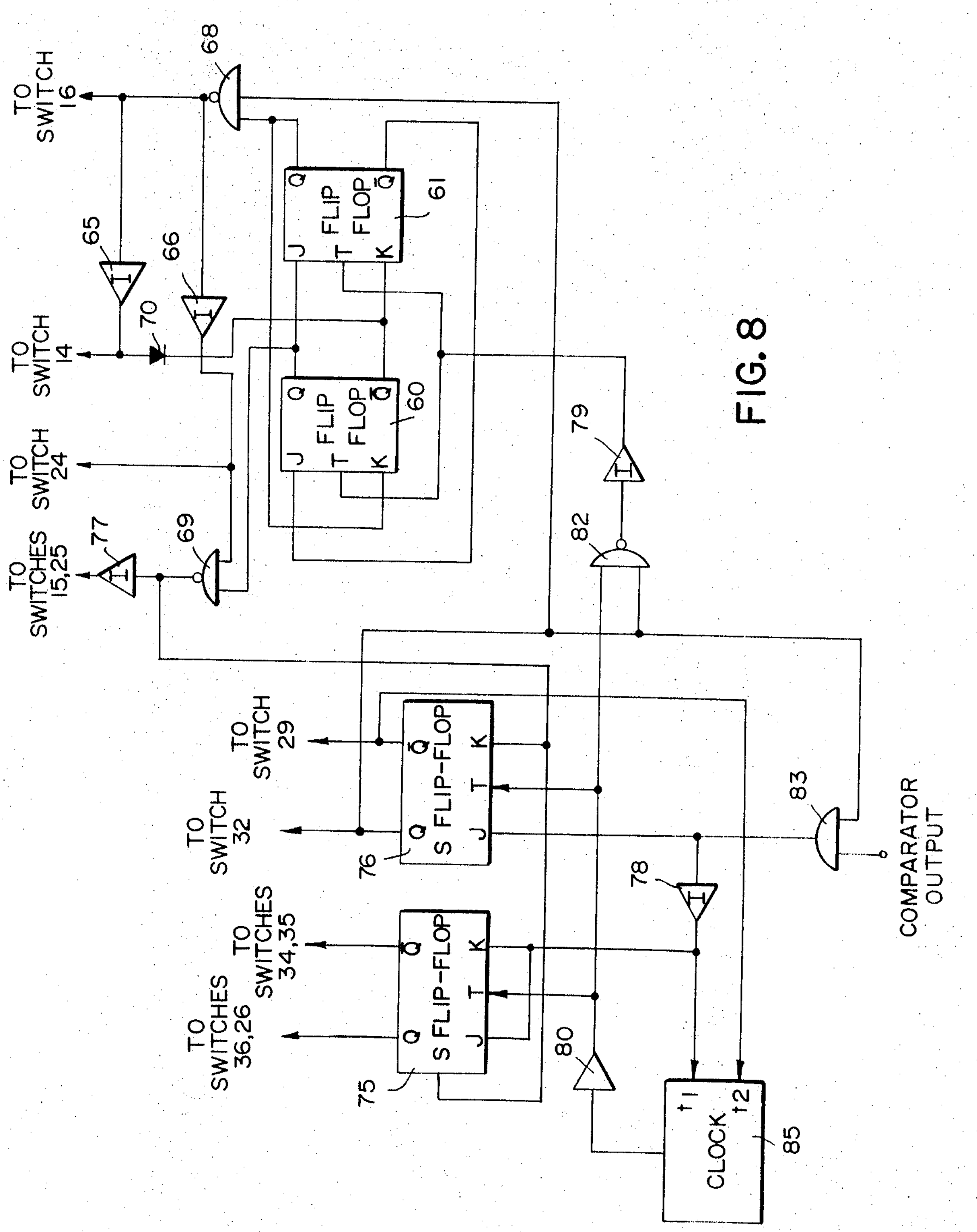
FIG. 8 is an illustration in block diagrammatic form of a programmer suitable for use in the practice of this invention.

While a variety of programmers may be employed in the system as illustrated in FIG. 4, one specific programmer which has proven suitable is shown in FIG. 8. The programmer has as its basic controlling element a 4 ring counter formed of a pair of flip-flop elements. Each of the flip-flop elements has a $j$ and $k$ input and a triggering input $t$. Each of the flip-flops has a $q$ and a $\bar{q}$ output. The logical operation of the flip-flop is such that a 1 at the $j$ input and a 0 at the $k$ input (where 1 may be a positive voltage and 0 a negative) will allow the flip-flop to respond to a triggering pulse at $t$ by changing to a state where the $q$ output is 1 and $\bar{q}$ is 0. For a 0 input at $j$ and a 1 input at $k$, the opposite is true, that is, a triggering pulse can change the state of the flip-flop so that the $q$ output is 0 and the $\bar{q}$ output is 1. A 1 input at both terminals $j$ and $k$ provides that each triggering pulse will change the state of the outputs.

The ring counter in FIG. 8 is formed of flip-flops 60 and 61 together with inverters 65 and 66 and NAND gates 68 and 69. In addition, a diode 70 is connected between the $\bar{q}$ output from flip-flop 60 and switch 14. T additional elements in the logic circuit include flip-flops 75 and 76, inverters 77, 78, 79 and 80, NAND gate 82, AND gate 83 and clock 85. A suitable configuration for the clock 85 is that illustrated in FIG. 7 with timing base $t_1$ resulting from actuation of the switch 56 and timing base $t_2$ resulting from actuation of switch 57. Throughout the description of the programmer it is assumed that a 1 output will result in the switch to which it is applied being closed. The actual switches may, of course, take several forms, for example, binary elements, switching transistors or the like.

In order to describe the operation of the programmer illustrated in FIG. 8, some one of the operating cycles must be assumed as a starting point. The DC stabilization of the amplifier (corresponding to event 7 in Chart I) is taken as the initial point and flip-flops 60, 61, 75 and 76 each are in the "1" state, where their $q$ outputs is 1. Gate 68 has a 1 input from flip-flop 61 and a 1 input from flip-flop 76 and accordingly its output is 0 and switch 16 is open. Gate 69 has a 1 input from flip-flop 60 and a 1 input through inverter 66 from the output of NAND gate 68 and accordingly this provides a logical 0 output, which, applied to the set input of flip-flop 75, forces this flip-flop to its 1 state. In addition, this 0 output from gate 69 through inverter 77 closes switches 15 and 25. Additionally, switch 24 is closed as a result of the inverted output from gate 68. Switch 14 is open since it receives a 0 signal from the $\bar{q}$ output of flip-flop 60. Switches 35 and 26 are closed while switches 34 and 36 are open because flip-flop 75 is in the "1" state and switch 32 is closed while switch 29 is open because flip-flop 76 is in the "1" state.

The 0 output from $\bar{q}$ of flip-flop 76 to clock 85 opens switch 56 causing a delay in the generation of the next clock pulse. On the next clock pulse output NAND gate 82 produces a 0 output which is inverted in inverter 79 and thus appears as a triggering pulse to flip-flops 60 and 61. Flip-flop 60 has a 0 on its $j$ input and a 1 on its $k$ input and therefore triggers into the 0 state in which the $q$ output is 0 and the $\bar{q}$ output is 1. Flip-flop 61 has a 0 input at its $k$ terminal and a 1 input at its $j$ terminal and thus does not undergo a change of state. Thus the ring counter advances one position only. Flip-flop 75 remains in the one condition because of its direct set input from gate 69 and flip-flop 76 remains in the one state because of the 0 on its $k$ input. Accordingly, switches 36, 26, 34, 35, 32 and 29 remain in the same position. The change of state of flip-flop 60 changes the output of NAND gate 69 from a 0 to a 1, which removes the set signal from flip-flop 75 and opens switches 15 and 25 through inverter 77. The "0" output from gate 68 inverted through inverter 65 coupled with the "1" at output $\bar{q}$ of flip-flop 60 acts through diode 70, to provide a closing signal to switch 14. The switches are now in the condition for event 1 of Chart I, that is, for storing the sampled analog input voltage $E_{in}$.

The next clock pulse from clock 85 steps the ring counter so that both flip-flops 60 and 61 are in the 0 state and additionally flip-flop 76 changes state since its $k$ input is at the one level. The change of state of flip-flop 76 causes the output of NAND gate 68 to go to 1, thus closing switch 16 and opening switches 14 and 24, while switches 15 and 25 remain open. Both the $t_1$ and $t_2$ inputs to the clock 85 are at the one level thereby providing for the shortest time constant, that is, where both switch 56 and 57 are closed. Provided that the comparator output remains at 0, flip-flop 76 cannot change state because it retains a 0 at its $j$ input. Gate 82 continues to provide a 1 output, thereby inhibiting propagation of pulses from clock 85 to the ring counter. Thus, each succeeding clock pulse will change the state only of flip-flop 75 which has a 1 input at both its $j$ and $k$ inputs resulting from the zero output of AND gate 83 through inverter 78. Under these conditions, switches 35 and 26 and switches 34 and 36 alternate between the open and closed position for each succeeding clock pulse and this alternation continues during the balance of the conversion cycle, event 2 in Chart I.

When the first digit conversion is complete the comparator output will go to 1, thereby providing an open signal to switch 56 in the clock and delaying the generation of the next clock pulse. The output from AND gate 83 also provides a 1 to the $j$ input of flip-flop 76. The delay in the time constant of the clock 85 allows the comparator time to settle and the next, delayed, pulse from the clock 85 will change the state of flip-flop 76 to the 1 state thereby allowing gate 82 to pass clock pulses to the ring counter. Since the inverted comparator output is now 0, flip-flop 75 does not change state in response to this pulse and switches 26, 36, 34, and 35 stay as they were. The change of state of flip-flop 76 results in switch 32 being closed and switch 29 opening, which conditions are required for operation 3 in the sequence of Chart I. The change of state of flip-flop 76 to the 1 state removes a 1 from one of the input legs of the AND gate 83 thereby returning the output of this AND gate 83 to 0. Thus the $j$ input to flip-flop 76 is once again 0. At the same time the $j$ and $k$ inputs to flip-flop 75 return to the 1 condition.

On the next clock pulse flip-flop 75 changes state, as does flip-flop 76 and the ring counter is stepped to the condition where flip-flop 60 is in the 1 state and flip-flop 61 is in the 0 state. This state of the ring counter does not change the condition of NAND gates 68 and 69, and hence there is no change in the conditions of the switches coupled to the output of these gates. Under these circumstances, the programmer operates in the same fashion as it did during operation 2 and the second digit is converted.

Once again when the comparator goes to a 1, those changes which occurred between operations 2 and 3 will take place and the converter is placed in condition for operation 5, thereby storing the remainder of the second digit conversion. At the conclusion of operation 5, the ring counter is again advanced so that both flip-flops 60 and 61 are in the "1" condition, thereby allowing the conversion of the third digit in operation 6. At the conclusion of this conversion flip-flop 76 will be in the "1" condition and NAND gates 68 and 69 both provide a 0 output. This is the same as the conditions at the initial step of the cycle and the cycle has been completed.

Figure 9:
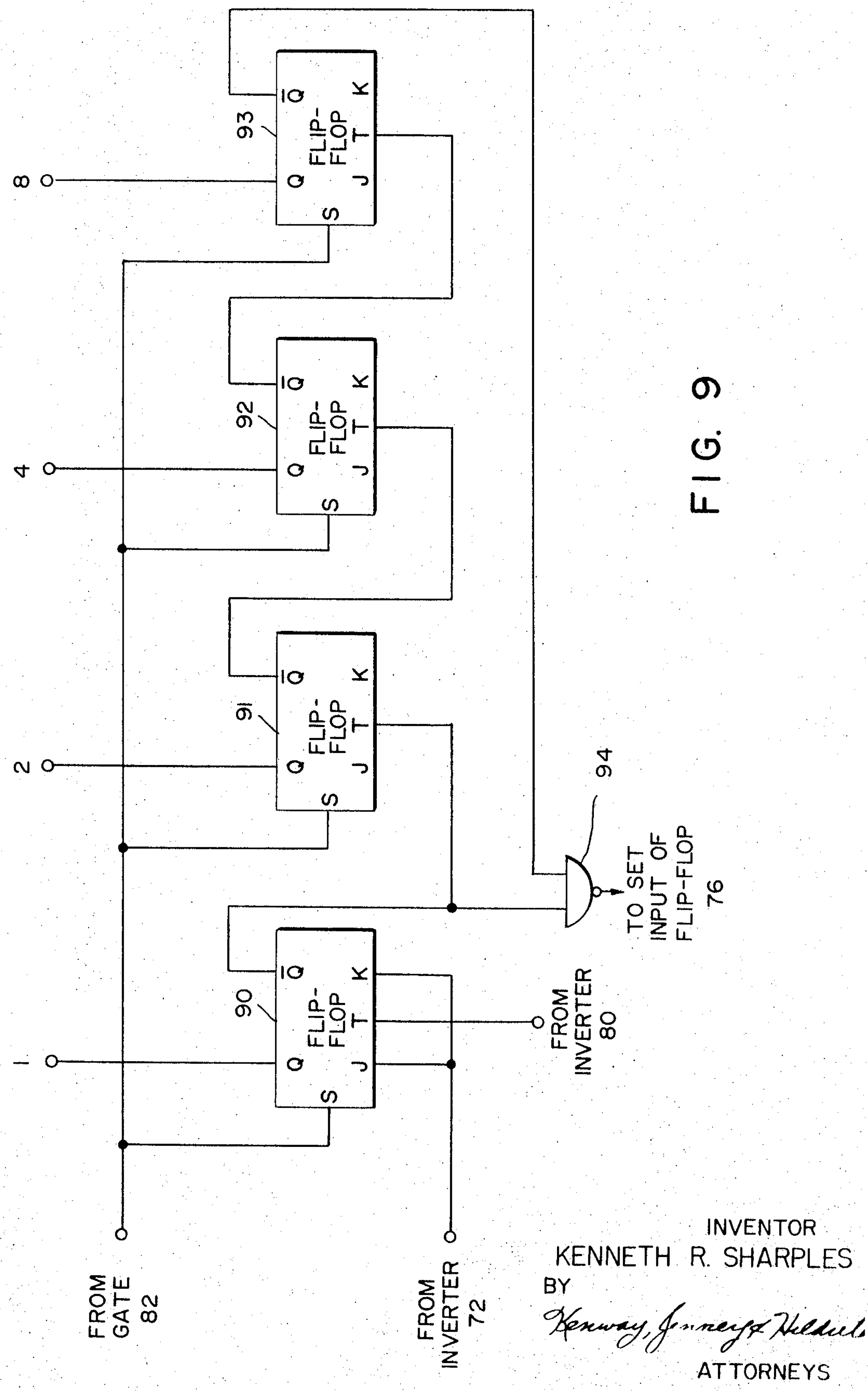
FIG. 9 is an illustration in block diagrammatic form of a register circuit suitable for use in the practice of this invention.

As previously indicated the digital value for each cycle of the converter is determined by accumulating the number of capacitor interchanges. In FIG. 9, there is illustrated a register to perform this accumulation. The register is formed of four flip-flop units 90, 91, 92 and 93, which are interconnected as a binary ripple counter. The counter is driven directly from the inverter 80 at the output of clock 85 and this signal is applied to the trigger input of the first flip-flop 90. The $j$ and $k$ inputs of flip-flop 90 receive an input signal from the inverter 78, which has a positive or 1 output only when there is no comparator output. Hence, this register is gated on only for clock pulses which occur while the repetitive subtraction process is taking place. The pulse output from gate 82, which pulse occurs at the beginning of each conversion operation, that is at the beginning of events 2, 4 and 6 of Chart I, is used to reset the ripple register. The register has an upper limit of accumulation of nine. The occurrence of a nine is represented by a zero output from the $\bar{q}$ outputs of both flip-flops 90 and 93 and these two are coupled to NAND gate 94, with the output of NAND gate 94 connected to the set input of flip-flop 76. This set input will drive flip-flop 76 to the 1 condition thereby inhibiting gate 82 and stopping the accumulation of further pulses in the register.

Figure 10:
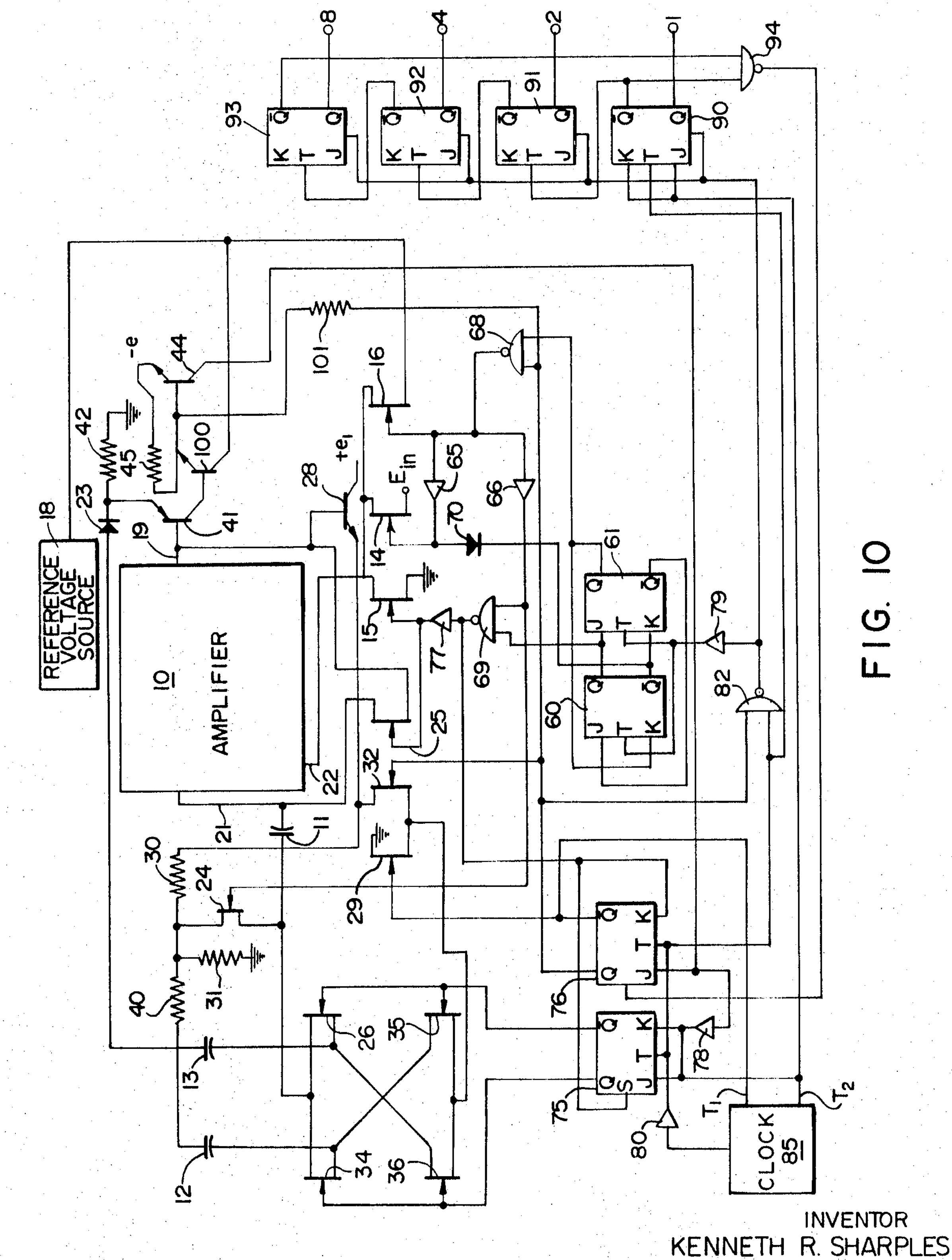
FIG. 10 is an illustration partially in schematic form and partially in block diagrammatic form of a converter, programmer and register suitable for use in the practice of this invention.

In FIG. 10 there is illustrated an overall schematic of the inverter including the programmer and register. Two additional elements are illustrated. The additional elements are a transistor 100 inserted between the comparator transistor 41 and the output comparator transistor 44 and a resistor 101 which couples a signal from the $q$ output of flip-flop 76 to the gate of transistor 44. Transistor 100 serves as a buffer amplifier between the comparator stages and resistor 101 serves to couple the $q$ output from flip-flop 76 to the base of transistor 44 thereby achieving the AND gate action illustrated in FIG. 8 as AND gate 83.

Each of the switches are shown as field effect transistors (FET) and the FET switches are controlled by signals applied to their gates. It is, of course, apparent that a number of specific elements may be employed in the circuitry of this invention without affecting the basic operation. Tabulated below are representative values for the components appearing in FIG. 10.

| Capacitors | | |
|---|---|---|
| 11 | .2 | Microfarods |
| 12 | .01 | Microfarods |
| 13 | .01 | Microfarods |

| Resistors | | |
|---|---|---|
| 30 | 1,000 | ohms |
| 31 | 100 | ohms |
| 40 | 1,000 | ohms |
| 42 | 10,000 | ohms |
| 45 | 240,000 | ohms |
| 101 | 200,000 | ohms |

Figure 11:
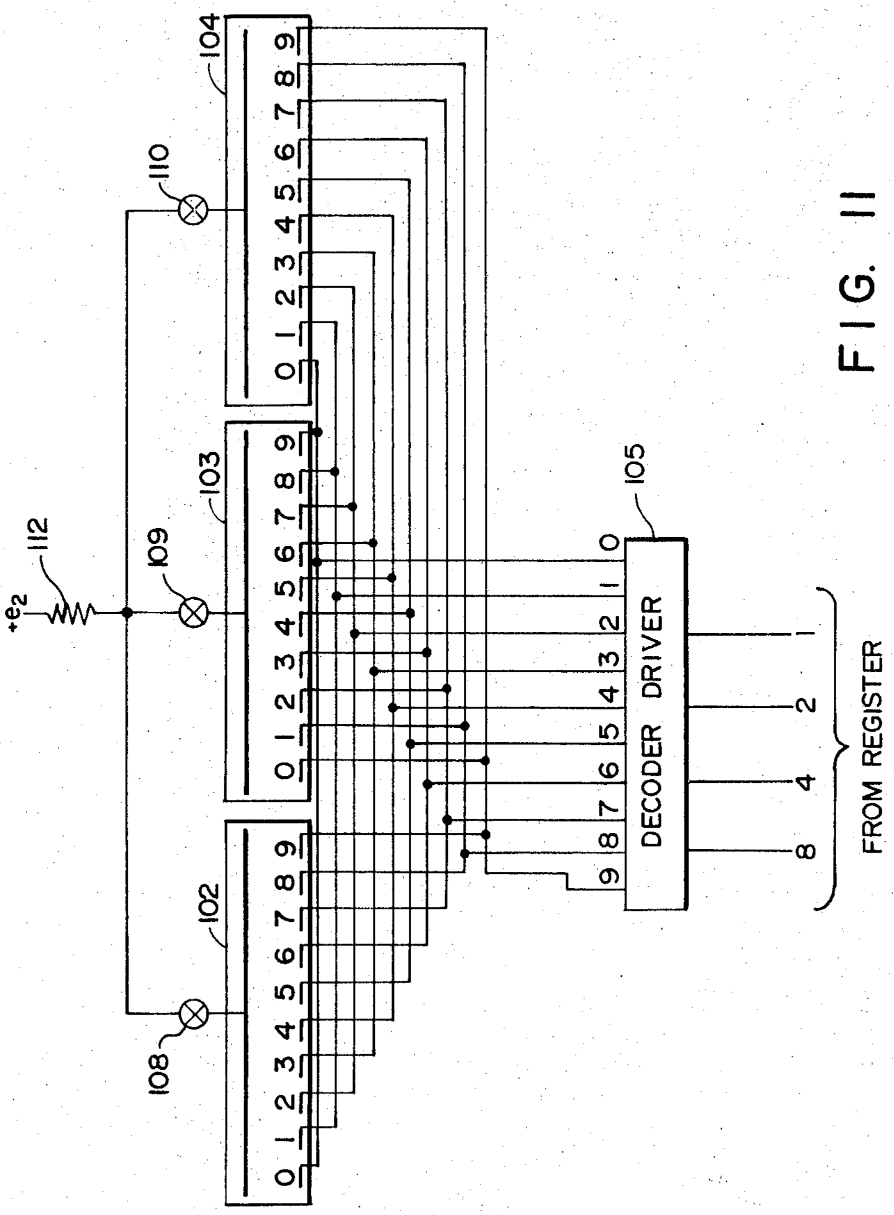
FIG. 11 is an illustration in block diagrammatic form of a display unit suitable for use in the practice of this invention.
Figure 12:
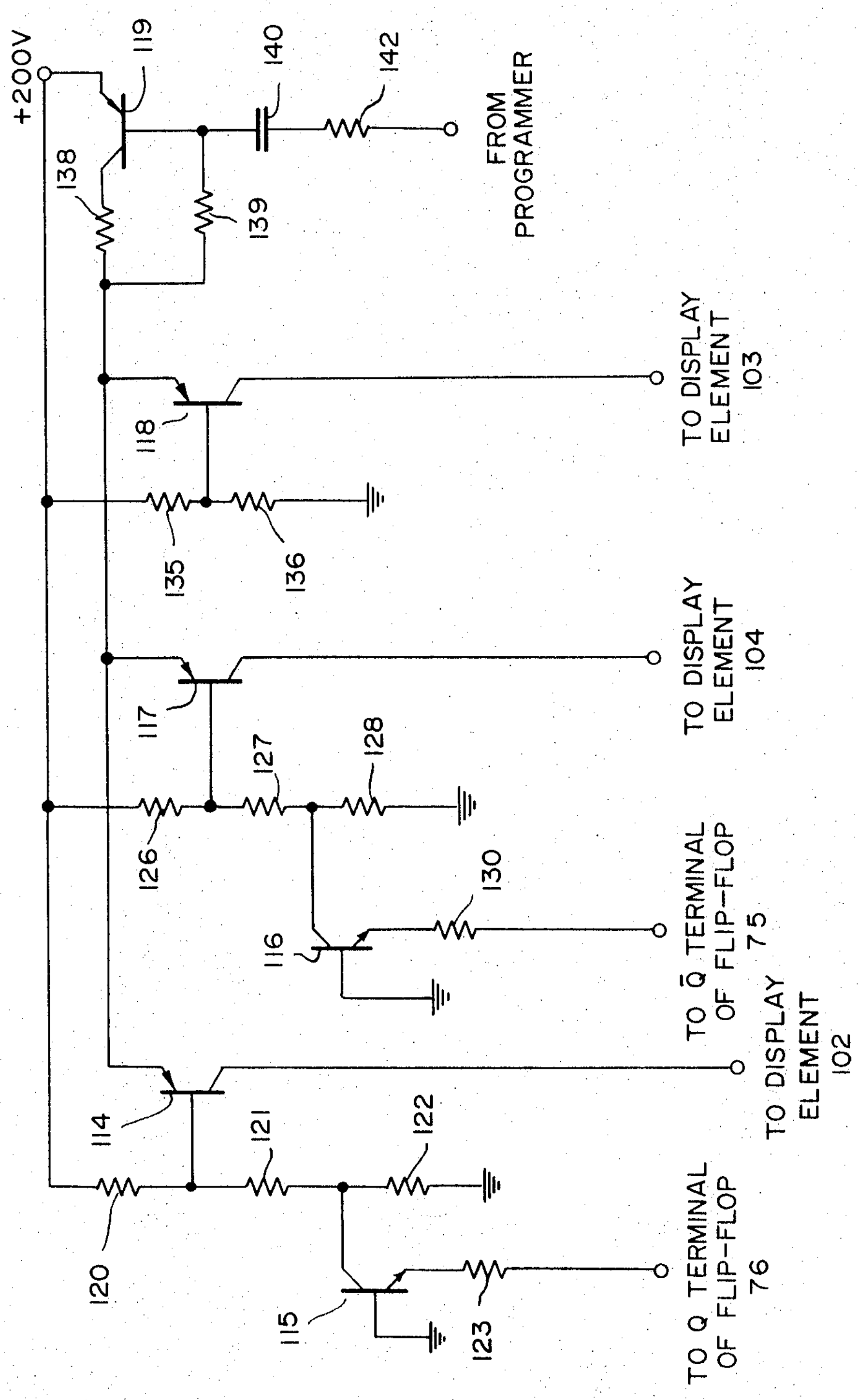
FIG. 12 is an illustration in schematic form of a multiplexer for use in conjunction with the display of FIG. 11.

FIGS. 11 and 12 illustrate a display system, which provides for a three digit output display of the digital values provided by the converter. The converter and its programmer are particularly suitable for use in a system with display tube multiplexing, that is in a system in which each of display tubes is sequentially sampled. The data generated by the converter comes out in a sequence in which the most significant digit is first generated, then the complement of the second digit and finally the third digit. By proper sequencing of the programmer, the system can be arranged to accumulate the first digit in the register, then display this digit in a suitable visual display, clear the register and disconnect it from actuating the first digital display, accumulate the second digit and actuate a second digit display from the register, then clear the register and disconnect it from the second digit display and accumulate the third digit and actuate the third display. Using this system only one register and one drive for the display are required and if the timing of this sequence is rapid enough, the visual data will appear as a normal three digit display.

Referring to the sequence of Chart I, an appropriate timing sequence to achieve this effect is set forth below with reference to the events of Chart I. The display units are actuated in events 3, 5 and 7, each display being actuated at a repetition rate dependent upon the number of subtractions required, typically an average of 150 times per second, for a duration of 1 millisecond once per conversion cycle. Each subtraction in a conversion cycle takes 100 microseconds. The extra delay at the end of digit conversion is 400 microseconds.

In FIG. 11, there is illustrated the three digit display employing three gas filled indicator tubes 102, 103 and 104 as the display elements. THe individual cathodes of each of the tubes 102, 103 and 104 are interconnected and are connected to a decoder driver unit 105, which decodes the output from the register illustrated in FIG. 8 and provides it as a decimal output. It should be noted that the connections to the cathodes of indicator tube 103 are reversed so that the zero cathode is connected to the nine's cathode of the other two display tubes, the one's cathode is connected to the eight's cathode of the other tube, etc. This corrects for the fact that the digital number generated for the second digit is the nine's complement of the actual digital value of the remainder. Connected to the anodes of each of the tubes 102, 103 and 104 are switches 108, 109 and 110 respectively and the other side of these switches is coupled through resistor 112 to a 200-volt supply, $e_2$. When anyone of the switches is actuated it provides current to its associated display tube thereby illuminating it. Thus, in this multiplexing arrangement, the tubes are illuminated only when their respective switch is closed and thus each one of the display tubes in in fact flickering. As above mentioned, however, if the flicker rate is high, (above about 50 c.p.s.) then the visual appearance will be the same as a constantly illuminated display.

In FIG. 12 the multiplexing circuit is illustrated. The collectors of each of the transistors 114, 117 and 118 are connected to the anodes of display elements 102, 104 and 103 respectively. By turning on the associated transistor, current is supplied only to the associated indicator tube.

In order to illuminate the first digit a negative signal appears at register 123 from the *q* terminal of flip-flop 76 and the collector of transistor 115 then goes to ground potential thereby decreasing the potential on the base of transistor 114 to a value lower than the potential on the bases of transistors 117 and 118. Thus transistor 114 is conducting while the transistors 117 and 118 are not.

In order to illuminate the second display tube 103, transistor 115 and transistor 116 must be nonconducting. Under these conditions the bias voltages for transistors 114 and 117 are such that their base potential is higher than that of transistor 118. This biasing arrangement is provided by the values of resistors 120, 121 and 122 for transistor 114, resistors 126, 127 and 128 for transistors 117 and resistors 135 and 136 for transistor 118.

In order to illuminate the third display tube, the negative signal is applied to resistor 130 thereby turning on transistor 116 and decreasing the potential at the base of transistor 117.

A signal is applied from the $\bar{q}$ terminal of flip-flop 76 in the programmer to resistor 142 in order to blank the illumination of the display tubes when the register is accumulating the value of a digit. The application of a positive signal to this point in the circuit increases the base potential of transistor 119 thereby inhibiting the current flow to any of the display elements.

When the system of the invention is operated as a bipolar analog to digital converter, the polarity output indication may be taken from the comparator output, since the initial polarity at the output of amplifier 19 will depend upon the polarity of the sampled analog input. This output may be coupled to a neon indication circuit (not shown), so that one polarity at the output of this amplifier will indicate one polarity of a sampled analog input voltage and the opposite polarity at the output of the amplifier will indicate the opposite polarity of the sampled voltage.

While the invention has been described in terms of a specific system, particular components and circuit configurations may be altered without changing the essence of the invention.

The invention having been described, various modifications and improvements will occur to those skilled in the art and the invention should be construed as limited only by the spirit and scope of the appended claims.

What I claim is:

1. A converter providing a digital output representation of an analog input voltage comprising, a high-gain amplifier, first and second capacitors, one side of said first capacitor being permanently and directly connected to one side of said second capacitor to form a common junction, the output of said amplifier being coupled directly to said common junction, a source of reference voltage, switching means for selectively interconnecting said reference source, the other sides of each of said first and second capacitors, said analog input voltage and said amplifier to sequentially charge one of said capacitors to a voltage related to said analog input voltage and thereafter repetitively interchange the positions of each of said capacitors to repetitively decrease the voltage stored on each of said capacitors by an increment having a fixed relation to the value of said reference voltage, until the voltage at the output of said amplifier changes polarity, and display means for displaying the number of times said switching means interchanges said capacitors as a digital output representation of said analog input voltage.

2. A converter in accordance with claim 1 and further including remainder amplifying means operable only after each change of polarity of said amplifier output signal to amplify by a specific factor the voltage difference between the voltage across the capacitor which was last charged prior to the change of polarity and said subtractive increment and to charge the other of said capacitors to a voltage equal to said amplified remainder, and wherein said switching means is thereafter operated to again interchange repetitively said capacitors to repetitively decrease said amplified remainder voltage by said increment until the amplifier output again changes polarity, the number of times said capacitors are interchanged between successive changes of polarity at said amplifier output providing additional digit information in a multidigit representation of said analog input voltage.

3. A converter in accordance with claim 2 and further including a series of independent display elements, the number of elements in said series being equal to the number of digits in said multidigit representation, and multiplexing means for coupling the number of switch interchanges to only said initial display element when said number of interchanges represents said first digit and to thereafter couple the number of capacitor interchanges occurring between each successive change of polarity at the output of said amplifier only to that one of said display element series corresponding to the represented digit.

4. A converter in accordance with claim 3 wherein said remainder multiplying factor is a factor of 10 and wherein each of said display elements is a decimal indicator and wherein said switching means is operated on a time cycle such that after each change of polarity at the output of said amplifier, a sufficient time is allowed before the next succession of capacitor interchanges to allow the number of capacitor interchanges occurring prior to this change of polarity to be recorded on the appropriate one of said display elements.

5. A converter for providing a digital output representation of an analog input voltage comprising, a high-gain amplifier having an input and an output, a first capacitor, a second capacitor, said first and second capacitors each having one side connected to the other at a common junction, said common junction being coupled to said amplifier output, a reference voltage source, sampling means for charging said first capacitor to a voltage related to said analog input voltage, first coupling means for coupling and decoupling the other side of one of said capacitors to said amplifier input and the other side of the remaining one of said capacitors to a point of potential reference, switching means for interchanging the connections between the other sides of said capacitors, said point of potential reference and said amplifier input, second coupling means for coupling said reference voltage source into the circuit including said amplifier, said capacitors, as said point of potential reference such that, in one position of said switching means said switching means said reference voltage source changes the potential of the noncommon side of one of said capacitors with respect to said point of potential reference and in another position of said switching means it changes the potential of the noncommon side of the other one of said capacitors with respect to said point of potential reference, and program means to sequence the operation of said first and second coupling means, said sampling means and said switching means to initially charge said first capacitor to said voltage related to the analog input and thereafter to repetitively decrease the voltage stored on each of said capacitors by an increment equal to the value of said reference voltage until the voltage on said amplifier output changes polarity, the number of times said switching means is operated to interchange said capacitors providing a digital value of said analog input voltage.

6. A converter in accordance with claim 5 and further including remainder amplifying means, operative upon the change of polarity of said amplifier output voltage to charge the one of said first and said second capacitors which is not coupled to said amplifier input to a voltage equal to 10 times the difference between the voltage across the one of said capacitors coupled to said amplifier input and said reference source potential, and program means operating thereafter to again sequence the operation of said first and second coupling means and said switching means to repetitively decrease the voltage stored on each of said capacitors by an increment equal to the value of said reference voltage until the voltage on said amplifier output terminal again changes polarity, the number of times said switching means is operated between said first and second changes of polarity providing an output indication of the nine's complement of a digital value for the second decimal place of a digital representation of said analog input voltage.

7. A converter in accordance with claim 5 wherein said sampling means comprises, means for coupling said analog input voltage between said amplifier input and said point of potential reference for a period sufficient to charge said first capacitor to said analog input voltage.

8. A converter in accordance with claim 5 wherein said sampling means includes means for initially charging said first capacitor to a voltage equal to 10 times the sampled analog input voltage, independent of the polarity of the sampled analog input voltage.

9. A converter for providing a digital output representation of an analog input voltage comprising, a high-gain amplifier having two input terminals and an output terminal;

a first capacitor;

a second capacitor, one side of said first capacitor being connected to one side of said second capacitor at a common junction, said common junction being coupled to said amplifier output terminal, a reference voltage source, first coupling means for coupling and decoupling said reference voltage source between a first one of said amplifier input terminals and a point of potential reference, sampling means for charging said first capacitor to a voltage related to said analog input voltage, second coupling means for coupling and decoupling the other side of said first capacitor to the second one of said amplifier input terminals and the other side of said second capacitor to said point of potential reference, switching means for interchanging the connections between the other sides of said capacitors and said point of potential reference and said second amplifier input terminal, and program means to sequence the operation of said first and second coupling means, said sampling means and said switching means to initially charge said first capacitor to said voltage related to the analog input and thereafter to repetitively decrease the voltage stored on each of said capacitors by an increment equal to the value of said reference voltage until the voltage on said amplifier output terminal changes polarity, and means providing a digital output indication of the number of times said switching means is operated to interchange said capacitors, as a digital value of said analog input voltage.

10. A converter in accordance with claim 9 and further including remainder amplifying means, operative upon the change of polarity of said amplifier output voltage, to charge the one of said first and second capacitors which is not coupled to said amplifier second input terminal, to a voltage equal to 10 times the difference between the voltage across the one of said capacitors coupled to said amplifier second input terminal and said reference source potential, said program means operating thereafter to again sequence the operation of said first and second coupling means, and said switching means to repetitively decrease the voltage stored on each of said capacitors by an increment equal to the value of said reference voltage until the voltage on said amplifier output terminal again changes polarity and wherein said means providing a digital output indication, provides an output indication of the nine's complement of the number of times said switching means is operated between said first and second changes of polarity, as a digital value of the second decimal place of a digital representation of said analog input voltage.

11. A converter in accordance with claim 9 wherein said sampling means comprises, means for coupling said analog input voltage between said amplifier first input terminal and said point of potential reference for a period sufficient to charge said first capacitor, said reference voltage source being decoupled from said amplifier first input terminal during said charging period.

12. A converter in accordance with claim 9 wherein said second coupling means includes, a third capacitor, having one side connected to said amplifier second input terminal, means for selectively coupling the other side of said third capacitor to either said point of potential reference or through said first switching means to the other side of said first and second capacitors, and shorting means operable to provide a short circuit between said amplifier output terminal and said amplifier input terminal, said program means operating said selective coupling means and said shorting means prior to the initial charging of said first capacitor to couple the other side of said third capacitor to said point of potential reference and short said output terminal to said input terminal thereby charging said third capacitor to the offset voltage of said amplifier.

13. A converter in accordance with claim 10 wherein said remainder amplifying means comprises, a first resistor connected between said common junction of said first and second capacitors and said point of potential reference, a second resistor, said second resistor being characterized by a resistance substantially 10 times that of said first resistor, a first diode connected in series with said second resistor between said amplifier output terminal and said common junction to pass current in a first direction, a second diode connected between said amplifier output terminal and said common junction to pass current in the opposite direction, and third switching means operative when the voltage at said amplifier output terminal changes polarity to decouple the other sides of said first and second capacitors from said point of potential reference and to couple the other side of that one of said capacitors which was connected to the point of potential reference to the junction between said second resistor and said first diode for a period sufficient to charge the connected one of said capacitors to the potential across said second resistor and thereafter to disconnect said other side from said junction and reconnect it to said point of potential reference.

14. A converter in accordance with claim 10 wherein said sampling means includes means for initially charging said first capacitor to a voltage equal to 10 times the sampled analog input voltage, independent of the polarity of the sampled analog input voltage.

15. A converter in accordance with claim 14 wherein said remainder amplifying means for amplifying the difference in voltage and for charging the first capacitor to 10 times the sampled analog input voltage comprises, first, second and third resistors, first and second diodes, and a second switching element, said first resistor being connected between said point of potential reference and the junction between said second and third resistors, said first diode being coupled between said amplifier output terminal and said capacitor's common junction in a direction to pass current in a first direction, said second diode being connected in series combination with second and third resistors between said amplifier output terminal and said capacitors common junction in a direction to pass current in the opposite direction, said second and third resistors each being characterized by a resistance value substantially 10 times the resistance value of said first resistor, said second switching element being connected from the junction of said second diode and said second resistor to said second coupling means, said program means operating said switching element such that when said sampling means is operated to initially charge said first capacitor, said switching element is connecting the other side of said first capacitor to the junction between said second diode and said second resistor.

16. A converter providing a digital output representation of an analog input voltage comprising, sampling means for sampling the instantaneous value of said analog input voltage periodically, a source of reference voltage, cyclically operable subtraction means for repetitively subtracting from said sampled analog input a voltage increment related to said source of reference potential, a register coupled to said subtraction means, a series of display elements coupled to said register, each of said display elements representing one digit in a decimal digit display, and program means for controlling the repetition rate of said sampling means and for cyclically operating said subtraction means and said display means such that said register accumulates from said subtraction means a number of pulses representing the first digit in a decimal digit representation of said sampled analog input voltage during a first cycle of operation of said subtraction means and provides a signal indicating said number to a first digit display element of said series and thereafter accumulates from a second cycle of operation of said subtraction means a number of pulses related to the value of the second decimal digit of a decimal digital representation of said analog input voltage and provides this number to a second display element of said series each of said display elements being actuated only when said register is providing a number to it, the time sequence of operation of said program means being such that said display element provides a visual display appearing to maintain the proper digital value at each display element during the operation of said converter.

UNITED STATES PATENT OFFICE

CERTIFICATE OF CORRECTION

Sheet 1

Patent No. 3,585,634 Dated June 15, 1971

Inventor(s) Kenneth R. Sharples

It is certified that error appears in the above-identified patent and that said Letters Patent are hereby corrected as shown below:

Column 1, line 41 reads

"count represents the digital value of the analog input."

should read

--count again represents the digital value of the analog input.--

Column 3, line 45 reads

"this timer to be connected to either the analog input terminal"

should read

--this terminal to be connected to either the analog input terminal--

Column 5, line 72 reads

"can switch the selected one of the indicators to a counter"

should read

--can switch the selected one of the output indicators to a counter--

UNITED STATES PATENT OFFICE Sheet 2

CERTIFICATE OF CORRECTION

Patent No. 3,585,634 Dated June 15, 1971

Inventor(s) Kenneth R. Sharples

It is certified that error appears in the above-identified patent and that said Letters Patent are hereby corrected as shown below:

Column 8, line 51, reads

"its basic controlling element a 4 ring counter formed of a pair"

should read

--its basic controlling element a ÷4 ring counter formed of a pair--

Column 8, line 67 reads

"from flip-flop 60 and switch 14. T additional elements in the"

should read

--from flip-flop 60 and switch 14. The additional elements in the --

Column 10, line 20 reads

"Once again when the comparator goes to a 1, those changes"

should read

--Once again when the comparator output goes to a 1, those changes--

UNITED STATES PATENT OFFICE
Sheet 3

CERTIFICATE OF CORRECTION

Patent No. 3,585,634 Dated June 15, 1971

Inventor(s) Kenneth R. Sharples

It is certified that error appears in the above-identified patent and that said Letters Patent are hereby corrected as shown below:

Column 11, line 68 reads

"each one of the display tubes in in fact flickering. As above"

should read

--each one of the display tubes is in fact flickering. As above--

Column 13, lines 51, 52 and 53 read

"capacitors, as said point of potential reference such that, in one position of said switching means said switching means said reference voltage source changes the poten"

should read

--capacitors, and said point of potential reference such that, in one position of said switching means said reference voltage source changes the poten--

Signed and sealed this 14th day of December 1971.

(SEAL)
Attest:

EDWARD M.FLETCHER,JR. ROBERT GOTTSCHALK
Attesting Officer Acting Commissioner of Patents